(12) United States Patent
Baluswamy

(10) Patent No.: US 7,268,869 B2
(45) Date of Patent: Sep. 11, 2007

(54) IN-SITU SPECTROGRAPH AND METHOD OF MEASURING LIGHT WAVELENGTH CHARACTERISTICS FOR PHOTOLITHOGRAPHY

(75) Inventor: Pary Baluswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 232 days.

(21) Appl. No.: 10/918,141

(22) Filed: Aug. 13, 2004

(65) Prior Publication Data

US 2006/0033912 A1 Feb. 16, 2006

(51) Int. Cl.
*G01J 3/28* (2006.01)
(52) U.S. Cl. .................. 356/305; 356/326; 356/328
(58) Field of Classification Search ........... 356/302, 356/305, 326, 328, 331, 334
See application file for complete search history.

(56) References Cited

U.S. PATENT DOCUMENTS

| | | | | |
|---|---|---|---|---|
| 4,462,688 | A | * | 7/1984 | Gold .................. 356/328 |
| 4,937,619 | A | | 6/1990 | Fukuda et al. |
| 5,198,872 | A | | 3/1993 | Wakabayashi et al. |
| 5,430,303 | A | * | 7/1995 | Matsumoto et al. ..... 250/492.2 |
| 5,774,205 | A | | 6/1998 | Sato |
| 5,963,324 | A | | 10/1999 | Murata |
| 6,037,082 | A | | 3/2000 | Capodieci |
| 6,160,831 | A | | 12/2000 | Kleinschmidt et al. |
| 6,295,123 | B1 | | 9/2001 | Wang |
| 6,320,663 | B1 | | 11/2001 | Ershov |
| 6,344,896 | B1 | | 2/2002 | Saito |
| 6,472,112 | B2 | | 10/2002 | Huh |
| 6,538,737 | B2 | | 3/2003 | Sandstrom et al. |
| 6,713,770 | B2 | | 3/2004 | Sandstrom et al. |
| 6,727,975 | B1 | | 4/2004 | Hickman |
| 2002/0003817 | A1 | | 1/2002 | Lokai et al. |
| 2003/0090643 | A1 | | 5/2003 | Sato |
| 2003/0133487 | A1 | | 7/2003 | Vogler |

\* cited by examiner

*Primary Examiner*—F. L. Evans
(74) *Attorney, Agent, or Firm*—TraskBritt

(57) ABSTRACT

An in-situ spectrograph having a spectrometer module positioned at a reticle plane or at a wafer plane of a photolithography projection system is disclosed. The spectrometer module disperses light projected from an illumination source, and the produced spectrum may be recorded. The spectrum may be recorded using a photodetector or a layer of photoresist. The recorded spectrums produced by illumination sources of a plurality of steppers may be compared, thus providing a comparison of the wavelength characteristics, particularly the wavelength spread and intensity of the light of the illumination sources. A plurality of spectrometer modules may be used to provide a comparison of the central wavelength of light produced by the illumination sources. The absolute wavelength of light produced by an illumination source may be determined using a spectrometer module having a spectrometer grating.

64 Claims, 12 Drawing Sheets

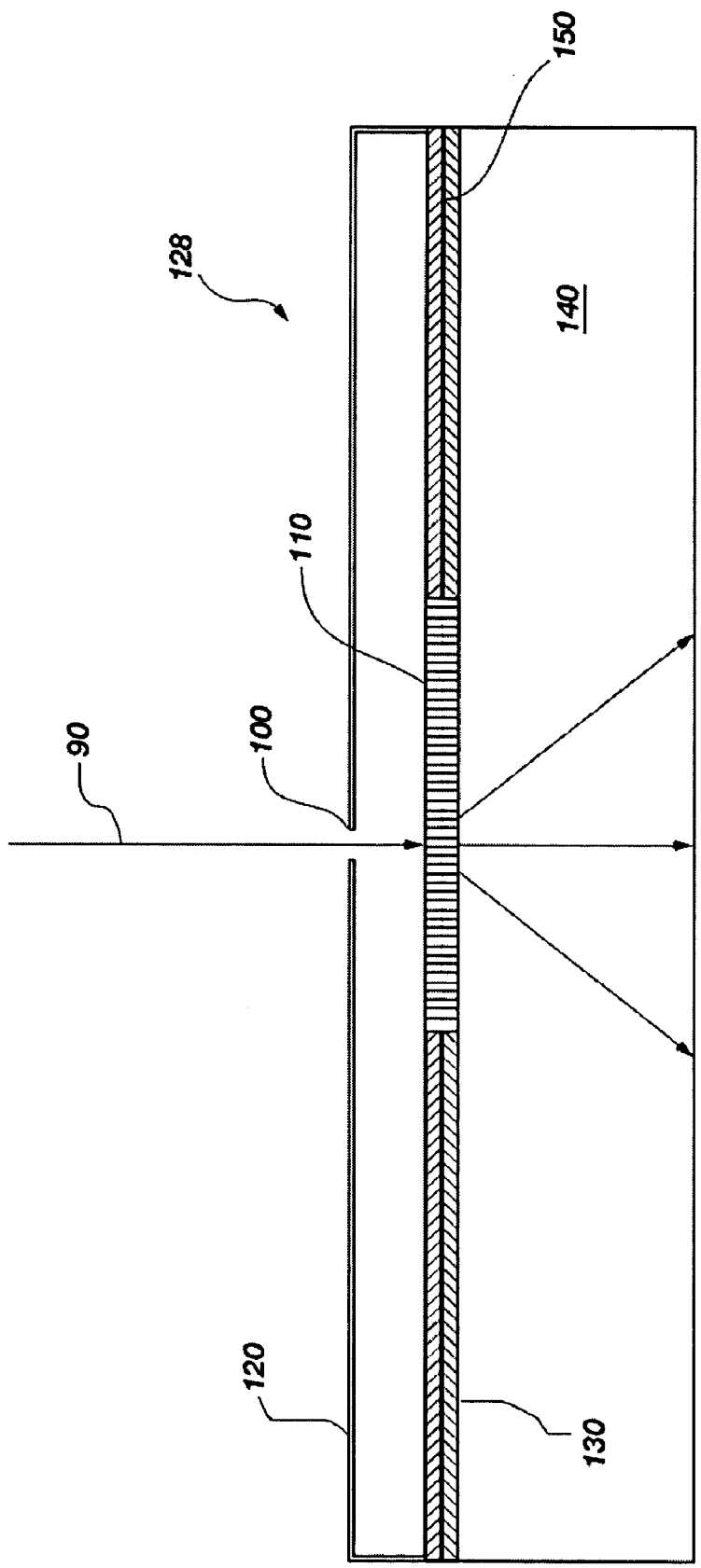

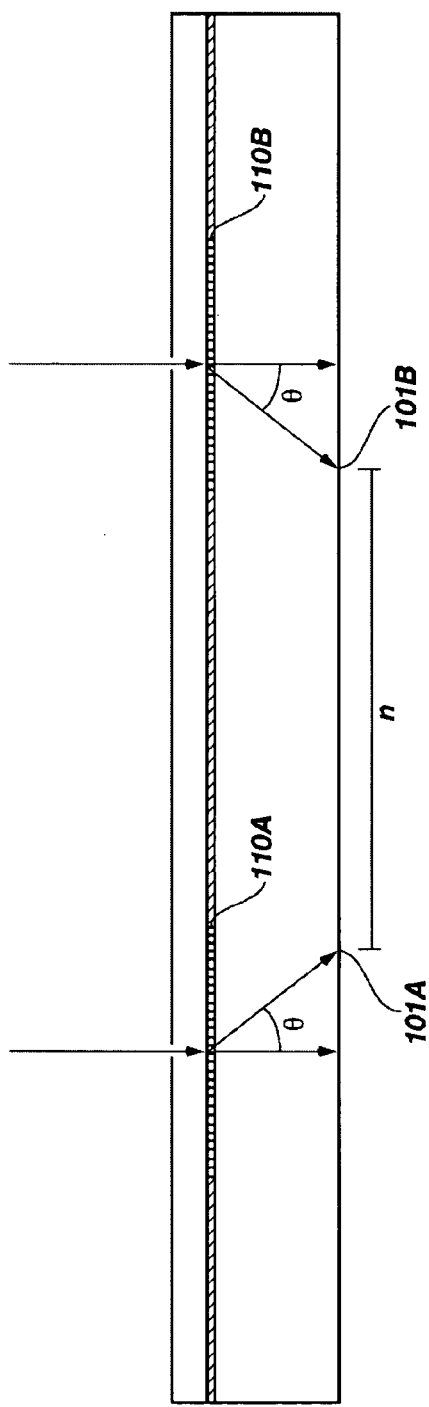
FIG. 10
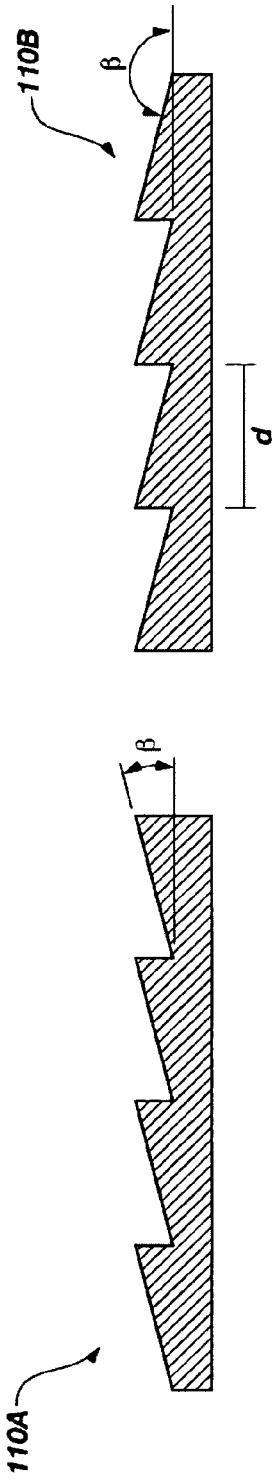
FIG. 11A
FIG. 11B

IN-SITU SPECTROGRAPH AND METHOD OF MEASURING LIGHT WAVELENGTH CHARACTERISTICS FOR PHOTOLITHOGRAPHY

BACKGROUND OF THE INVENTION

1. Field of the Invention

The present invention relates to an in-situ spectrograph suitable for use in stepper matching during photolithography processes as used in the fabrication of semiconductor devices.

2. State of the Art

Conventionally, semiconductor devices are fabricated in part through the use of optical lithography techniques using projection imaging systems known as steppers. An exemplary projection image system 20 is illustrated in FIG. 1. The projection image system 20 at a minimum includes an illumination controller 22 and an illumination source 24 coupled with and controlled by the illumination controller 22. Illumination source 24 may include a mirror, a lamp, a laser, a light filter, and/or a condenser lens system. As used herein, the term "light" refers to light used in photolithography. The term "light" need not be restricted to visible light, but may also include other forms of radiation suitable for use in lithography. For example, energy supplied by lasers, photons, ion beams, electron beams, or X-rays are included within the term "light." Excimer lasers and other pulsed radiation sources are typically used in photolithography processes.

Illumination source 24 emits light or radiation that can pass through openings in a reticle 26. The reticle typically comprises a photomask formed on a glass blank. Conventional materials for the blank include soda-lime glass, borosilicate glass or fused silica. The photomask is formed by a film of opaque material. Conventionally, the film is formed with chrome less than 100 nm thick and covered with an anti-reflective coating, such as chrome oxide. The purpose of the anti-reflective coating is to suppress ghost images from the light reflected by the opaque material. The photomask may include a pattern for projecting a wiring or feature pattern of an integrated circuit. The pattern may include various image structures, for example, clear areas, opaque areas, phase shifting areas, and overlay targets. The reticle 26 generally comprises a combination of clear areas and opaque areas, where the clear areas allow light from the illumination source 24 to pass through the mask of the reticle 26 to form the reticle image.

Conventionally, a thin transparent membrane, referred to as a pellicle membrane, is applied over the photomask portion of the reticle to keep the photomask portion free of foreign particles and is usually positioned at a selected height above the photomask. Such height is greater than the focal length of the light imaged onto the photomask. Thus, small particles on the pellicle membrane will not block light from reaching the photomask.

The projection image system 20 shows the reticle 26 positioned adjacent to the illumination source 24; optionally, other devices such as the pellicle or optical lenses may be interposed between the illumination source 24 and the reticle 26. Light passing through the reticle 26 is further transmitted by a projection lens 30, which may be, for example, a reduction lens or a combination of lenses for focusing the reticle pattern onto a projection surface 111. Typical semiconductor fabrication photolithography techniques employ a four- to ten-times reduction of the reticle size by projection lens 30. Projection surface 111 is held in position by a stage, or holding device (not shown), which may be part of or controlled by a stepper (not shown).

In photolithography equipment, a reticle stage may support the reticle and a wafer stage may support the semiconductor wafer, i.e., the work piece being processed. The stages, as well known in the art, typically provide precision motion in the X-axis and Y-axis directions and often some slight provision is made for adjustments in the vertical (Z-axis) direction. A reticle stage is typically used where the reticle is being scanned in a scanning exposure system, to provide smooth and precise scanning motion in one linear direction and insuring accurate, reticle to wafer alignment by controlling small displacement motion perpendicular to the scanning direction and a small amount of "yaw" (rotation) in the X-Y plane. The light may be directed through the reticle and through the stage itself to the underlying projection lens. Thus, the stage itself provides passage for the light.

The projection surface 111 conventionally employed in the manufacture of semiconductor devices typically includes photoresist material disposed over a layer of a semiconductor device structure, such as a wafer or bulk semiconductor material that is to be patterned. The light directed through the reticle may now "expose" and fix portions of the photoresist to define an etch mask pattern in the photoresist.

The photoresist may be developed by removing either the exposed portions of resist for a positive resist or the unexposed portion for a negative resist to form the etch mask. The substrate is subsequently processed as by etching to form the desired structures followed by removal of the photoresist, if desired or required.

As dimensions of features on semiconductor devices continue to decrease, the resolution limits of optical lithography are quickly being reached. One limit is caused by proper positioning of the projection surface in the optimum focal plane, further hampered by insufficient depth of focus. Over the past decade photolithographic systems have evolved through several generations. The wavelength of the illumination source has steadily decreased from 365 nm (i-line of mercury) to 257 nm (high-pressure mercury arc lamp) to 248 nm (KrF laser), and is presently at 193 nm (ArF excimer laser). The numerical aperture ($NA_o$) of the projection lens, having increased from its value of ~0.16 in the early days to ~0.86 in present-day systems, is likely to increase still further. Since the resolution limit in the reduction projection exposure method is in proportion to the exposure wavelength and is in inverse proportion to the numerical aperture of the protection lens, resolution improvement has been promoted by the shortening the exposure wavelength and increasing the numerical aperture of the projection lens. On the other hand, the depth of focus of the projection lens is in proportion to the exposure length, and is in inverse proportion to the square of the numerical aperture of the projection lens. By attempting to improve the resolution, therefore, the depth of focus has been abruptly decreased. That is to say, it is difficult to make fine patterns compatible with providing sufficient depth of focus. Especially when high resolution is the goal, the depth of focus becomes very shallow. Therefore, as images are exposed, because of the relatively small dimensional tolerances and high dimensional resolution that are desired of the various structures of semiconductor devices, it is extremely important that the projection surface be as close to the optimum focal plane as possible.

Illumination source settings are a significant factor for optimizing the focal plane, and thus semiconductor device feature dimensions, as the illumination source settings often change from one stepper to another. For example, if the illumination source of a given stepper has different settings than those used with the illumination source of another stepper in the same fabrication process, the light, having different wavelengths, will be refracted differently by the reticle 26 (FIG. 1). The light will therefore enter and exit the projection lens 30 at different locations. Refraction is the bending of a wave resulting from a change in its phase velocity as its moves from one medium to another having a different index of refraction. The index of refraction and, therefore, the bending of the wave, varies with the frequency of radiation (or wavelength) of light.

The light exiting the projection lens 30 at different locations results in a change of the focal plane of the reticle. Such a change of the focal plane due to the different wavelength of the light can result in bad registration of the image onto the wafer, which, in turn, can result in bad overlay from one pattern to another.

The measurement of overlay between successive patterned layers on a wafer is one of the most critical process control techniques used in the manufacturing of integrated circuits and devices. Overlay generally pertains to the determination of how accurately a first patterned layer aligns with respect to a second patterned layer disposed above or below it. A stepper's optical characteristics, such as the illumination source settings and optical aberrations of the lithographic lens system, have a strong influence on overlay and critical dimension performance when patterning advanced design rule integrated circuits. Stepper matching has been utilized to reduce the impact of optical aberrations on wafer processing.

Stepper matching generally refers to the process of determining which steppers work well together, i.e., matching steppers such that when two layers are printed using different steppers, there is a minimum overlay error between the two layers. As should be appreciated, every stepper has its own unique signature of aberrations or other errors and therefore each stepper tends to print patterns differently for a given set of process conditions. The steppers that print patterns in a similar manner are matched to minimize the impact of these aberrations and other errors over the entire process. In most cases, stepper matching is performed by providing a golden wafer having a standard pattern; printing patterns on the golden wafer with each stepper using the same reticle and processing conditions; and calculating the relative difference between each of the steppers by comparing the alignment between the standard pattern and each of the stepper patterns. If the alignment between steppers is similar, then the steppers tend to work well together. If the alignment between steppers is different, then the steppers may not work well together. Although stepper matching for optical aberrations of the lithographic lens system provides some benefit, it is not ideal, since it does not provide feedback about the wavelengths of the illumination sources of the various steppers.

Calibrating the absolute emission wavelength of an excimer laser is described in U.S. Pat. No. 6,160,831 to Kleinschmidt. However, within different steppers the illumination source may have different means for focusing, projecting, and amplifying the light, for example, mirrors, light filters, and/or a condenser lens system. This will give different spectral "signatures" for different steppers; for example, the intensity distribution and spread of the light will differ. The different spectral signatures, will also affect which steppers work well together. A change in the spread of the illumination source wavelength and the intensity over the spread may also cause the image to be out of focus, also known as image "smear." Therefore, merely calibrating the absolute wavelength of an excimer laser within an illumination source will not match the spectral signatures of different steppers.

Accordingly, in order to improve the quality of patterns transferred to photoresists using photolithography, a need exists for a device and system suitable for measuring and comparing the wavelength characteristics of illumination sources of different steppers.

BRIEF SUMMARY OF THE INVENTION

The present invention, in a number of exemplary embodiments, includes an in-situ spectrograph device for a photolithography projection system, as well as a method for measuring wavelength characteristics of an illumination source in a photolithography projection system. The measured wavelength characteristics may be used in a method for stepper matching.

In one aspect of the present invention, a photolithography projection system includes an illumination source configured for producing light defined using an opaque pellicle, including a beam defining aperture. A spectrometer module is positioned in a reticle plane of the projection system to disperse the light, separating the light by wavelength, producing a spectrum. The dispersed light may pass through a projection lens, and an associated recording device is configured to record the produced spectrum, or dispersed light pattern. The spectrometer module may be either supported by a reticle stage or built into the reticle stage. The recording device may be positioned at a wafer plane, configured to record the spectrum transmitted by the projection lens. Alternatively, a reflection device may be positioned at the wafer plane, and the recording device may be configured to record a reflected spectrum.

In another aspect of the present invention, a photolithography projection system includes an illumination source for producing light and a spectrometer module positioned in a wafer plane of the projection system to disperse the light, separating the light by wavelength. The light produced by the illumination source may be received by a projection lens, and projected through a beam defining aperture to the spectrometer module to produce a spectrum. A recording device may record the produced spectrum. The spectrometer module may be either supported by a reticle wafer or built into the wafer stage. The recording device may be positioned below the wafer plane, configured to record the produced spectrum. Alternatively, a reflection device may be positioned at the wafer plane, and the recording device may be configured to record a reflected spectrum.

One method according to the present invention for measuring wavelength characteristics of an illumination source in a photolithography projection system includes producing light, separating the light at the reticle plane using a spectrometer module, and recording the spectrum produced by the separated light. The spread of the wavelength of the light and the intensity of the light over the spread may be measured. The spectrum may be recorded at the wafer plane, below the wafer plane, or a reflected spectrum may be recorded. The light may, alternatively, be separated at the wafer plane.

The recorded spectrum of an illumination source under test may be compared with the recorded spectrum of a standard illumination source. The illumination source under test may be adjusted to change the illumination source wavelength characteristics. Alternatively, steppers having illumination sources with similar recorded spectrums and, thus, similar illumination source wavelength characteristics may be used together in a fabrication process.

A method according to the present invention for measuring the central wavelength includes projecting light through multiple spectrometer modules and measuring the distance between two spectrums imaged by two spectrometer modules. The distance between the same two spectrums imaged by the same two spectrometer modules using a different illumination source provides a comparison of the central wavelength of the illumination sources.

The absolute wavelength of light produced by an illumination source of a projection optical system may be measured using a spectrometer module having a spectrometer grating. The distance between the intensity peaks of two groups of properly coinciding spectral images is equivalent to the absolute wavelength.

Other features and advantages of the present invention will become apparent to those of skill in the art through consideration of the ensuing description, the accompanying drawings, and the appended claims.

BRIEF DESCRIPTION OF THE SEVERAL VIEWS OF THE DRAWINGS

In the drawings, which illustrate what is currently considered to be the best mode for carrying out the invention:

FIG. 2A is a schematic view of a first exemplary embodiment of a spectrometer module according to the present invention;

FIG. 10 is a schematic view of another embodiment of a spectrograph according to the present invention;

FIG. 11A is a cross-sectional view of an exemplary blazed diffraction grating; and FIG. 11B is a cross-sectional view of another exemplary blazed diffraction grating.

DETAILED DESCRIPTION OF THE INVENTION

In accordance with one aspect of the present invention, an in-situ spectrograph is provided to compare a plurality of illumination sources for stepper matching. The in-situ spectrograph may be in the form of a spectrometer module for producing a spectrum representing the intensity of light produced by an illumination source at each part of the spectrum. Separation or dispersion of the light into different wavelengths may be accomplished with refraction through a prism or diffraction through a diffraction grating. The present invention may be used in photolithographic processing for fabrication of semiconductor devices, such as (by way of example only) Dynamic Random Access Memory (DRAM) dice, Static Random Access Memory (SRAM) dice, CMOS imager dice, charge coupled devices (CCDs), flash memory dice and processor dice, as well as liquid crystal display elements, thin-film magnetic heads, reticles, and for many other applications that require accurate photolithographic imaging. The present invention may be used with systems that employ step-and-repeat or step-and-scan type projection printing, or other similar systems.

A spectrometer module may comprise a photomask formed on a substrate as shown in FIG. 2A. The substrate 140 may comprise any material having good insulative and light-transmissive characteristics, including, by way of example only, soda-lime glass, borosilicate glass, quartz, and fused silica. The photomask 130 is formed by a film of opaque material. Typically, the film is formed of chrome less than 100 nm thick and may be covered with an anti-reflective coating 150. The anti-reflective coating 150 may comprise an inorganic or organic antireflective material. Suitable inorganic materials may include, but are not limited to, titanium, titanium nitride, titanium dioxide, titanium oxynitride, inorganic polymers, chrome oxynitride, chromium oxide, amorphous carbon, amorphous silicon, silicon nitride, and titanium tungsten. Suitable organic materials may include organic resins or polymers that optionally include light-absorbing dyes.

Figure 1:
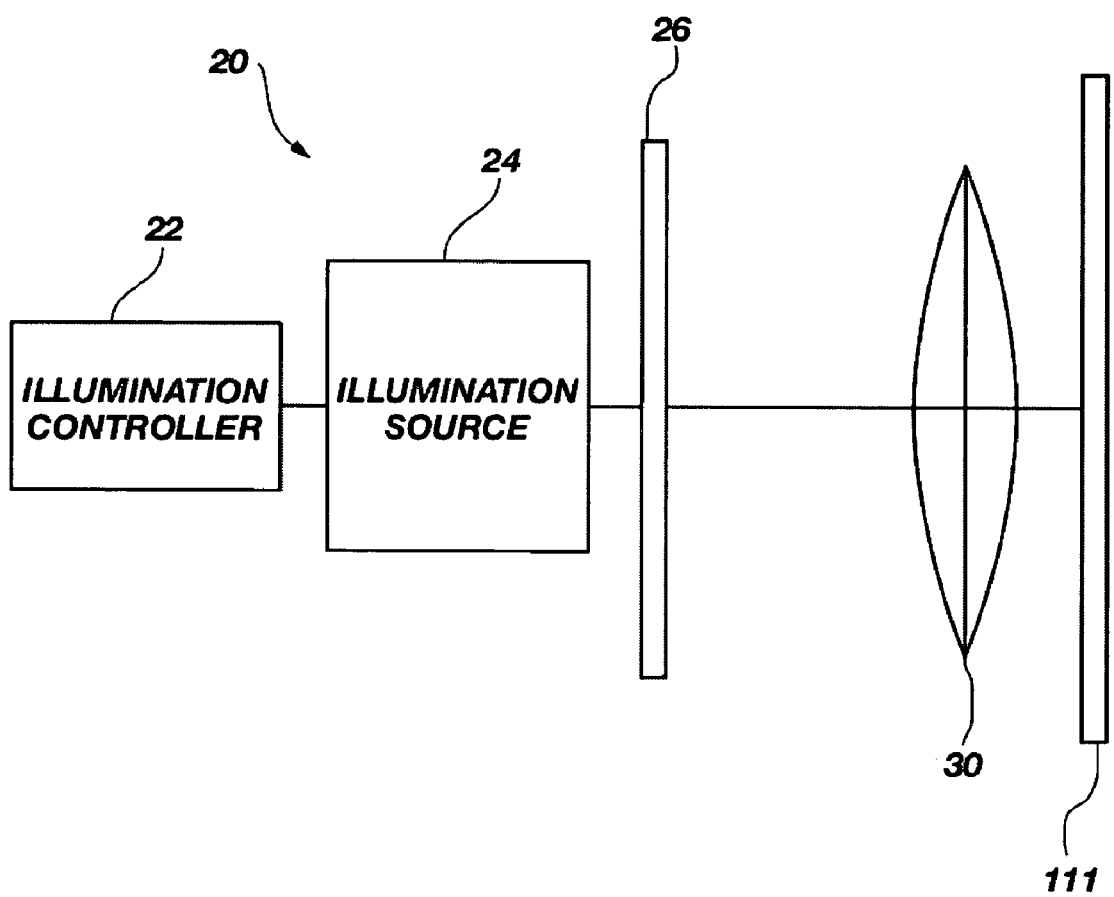
FIG. 1 is a schematic illustration of a conventional optical imaging projection system.
Figure 2B:
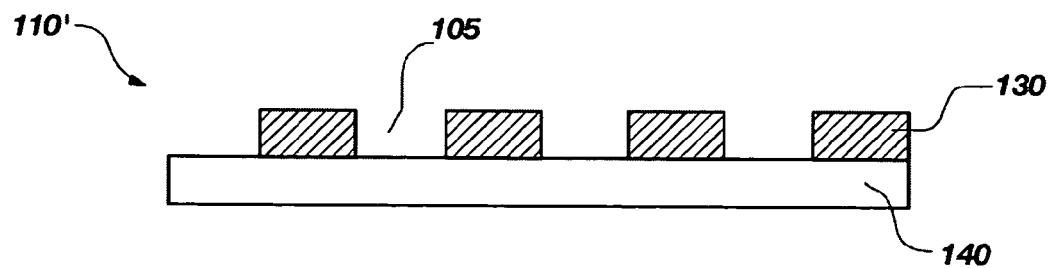
FIG. 2B is a cross-sectional view of an exemplary patterned diffraction grating.

The diffraction grating 110 may be any periodic arrangement of diffracting elements, for example, as shown in FIG. 2B, the photomask may be patterned as a diffraction grating 110'. Equidistant slit apertures 105 in the opaque material film of the photomask 130 form the diffracting elements of the patterned diffraction grating 110'. Fabrication of the photomask pattern may be effected using masking and etching techniques common to photolithography processing used in the semiconductor fabrication industry.

Figure 2C:
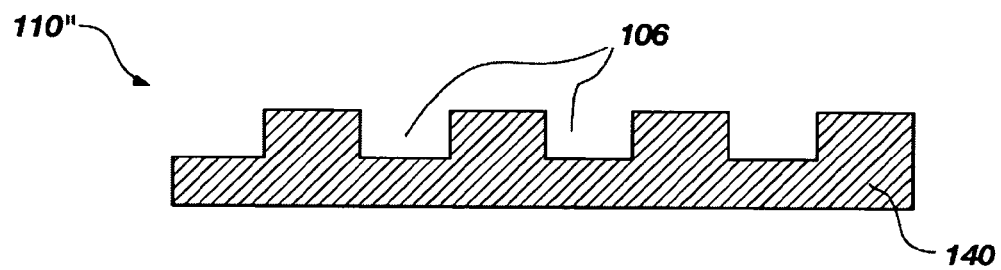
FIG. 2C is a cross-sectional view of an exemplary surface-relief type diffraction grating.
Figure 2D:
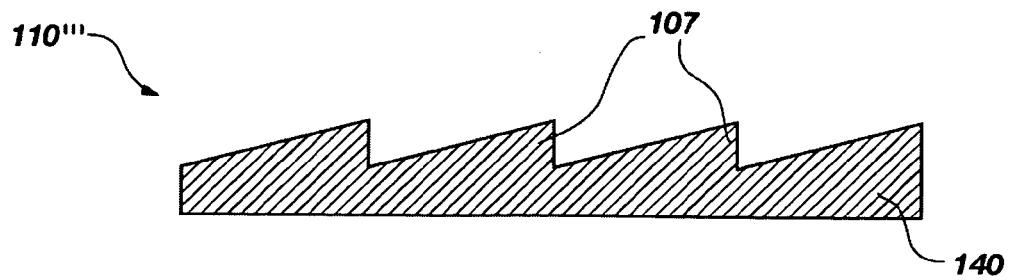
FIG. 2D is a cross-sectional view of an exemplary blazed diffraction grating.

Alternatively, a surface-relief type diffraction grating, as shown in FIGS. 2C and 2D may be used. The diffracting elements 106 of diffraction grating 110" shown in FIG. 2C comprise a pattern of surface grooves in the substrate 140. The diffraction grating may be a blazed grating 110''', as shown in FIG. 2D, which will change the angle of incidence of the light and alter the width of the spread. The diffracting elements 107 of the blazed grating 110''' are asymmetric with respect to the normal plane of the surface of the substrate 140. The diffraction grating 110 may also be formed by the periodic variation of the refractive index inside the body of the diffraction grating. Such a diffraction grating using internal modulation of the refractive index is known as a volume phase grating.

Figure 2E:
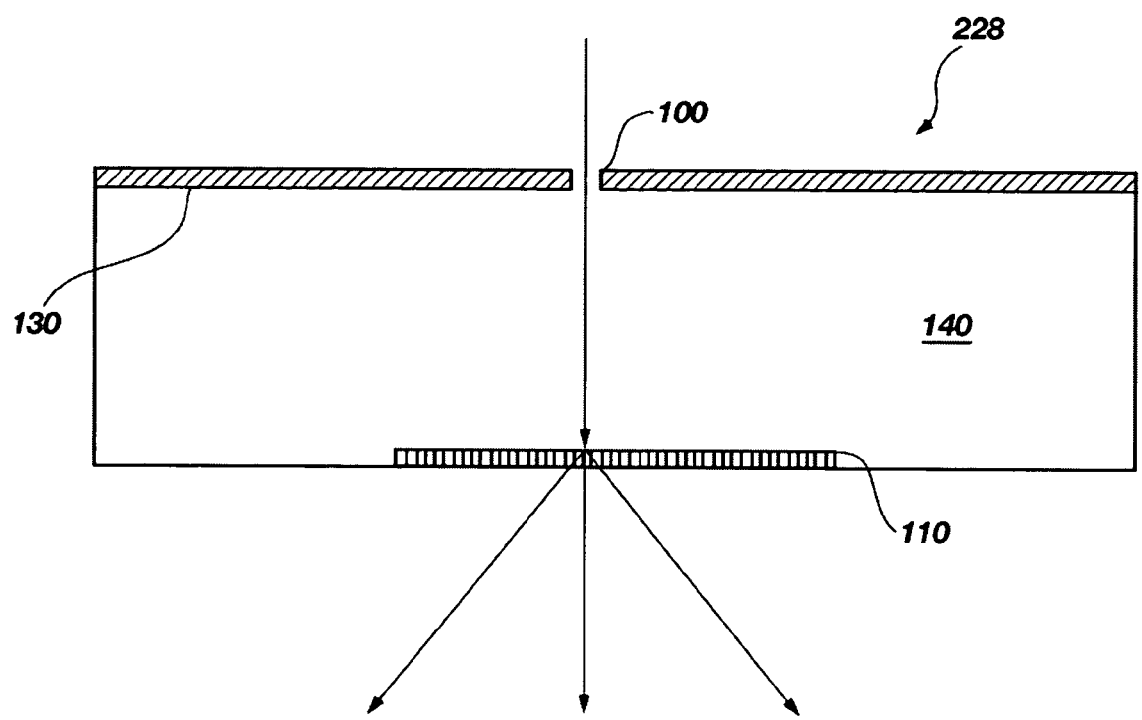
FIG. 2E is a schematic view of a second exemplary embodiment of a spectrometer module according to the present invention.

Referring back to FIG. 2A, an opaque pellicle 120 having a beam-defining aperture may optionally be included in the spectrometer module 128. The beam-defining aperture 100 controls the dimension of a beam of light 90 produced by an illumination source (not shown) before the light 90 reaches the diffraction grating 110. The opaque pellicle 120 may be formed of any suitable opaque material, such as steel. FIG. 2E depicts another embodiment of the invention comprising a spectrometer module 228, which does not include an opaque pellicle. The beam-defining aperture 100 may be located in the photomask 130, and the diffraction grating 110 formed as diffracting elements etched on the lower surface of the substrate 140.

When the beam of light 90 from the illumination source strikes the diffraction grating 110, it is dispersed. Because the angle of deviation of the diffracted light is wavelength-dependent, the diffraction grating separates the incident beam spatially into its constituent wavelength components, producing a spectrum. The spectrum, representing the intensity of the light at each wavelength, may be recorded by a recording device, as described below.

Figure 3:
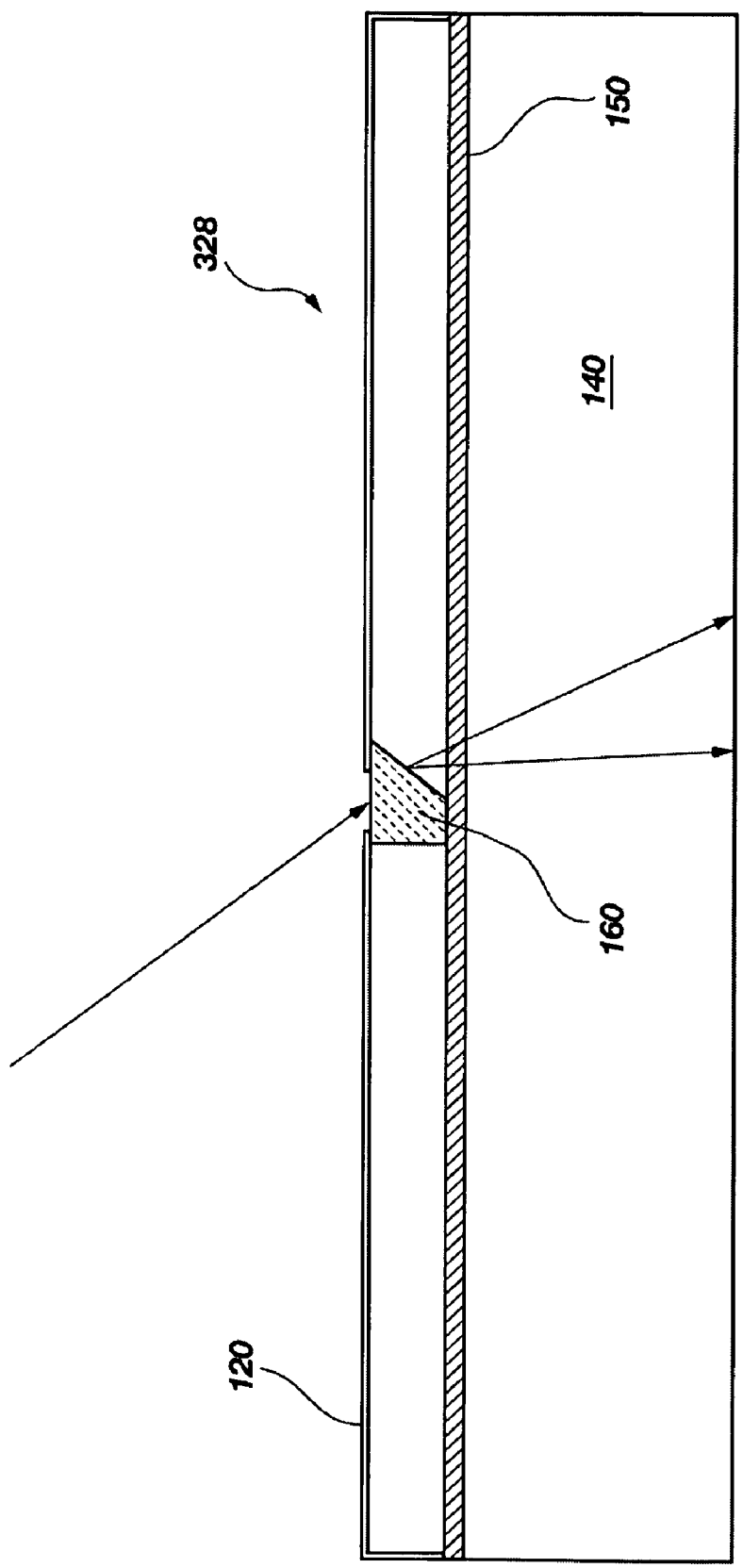
FIG. 3 is a schematic view of a third exemplary embodiment of a spectrometer module according to the present invention.

In a third embodiment of the invention, a spectrometer module 328 may comprise a prism 160 located on a substrate 140, below the opaque pellicle 120 as shown in FIG. 3. Conventional materials for the substrate 140 include soda-lime glass, borosilicate glass, quartz, or fused silica. The prism may be formed from the same conventional materials, or any transparent material known in the art having a wavelength dependent refractive index. An antireflective coating 150, such as chrome oxide, may be positioned on the substrate 140 under the prism 160.

The angle of refraction of the light from the illumination source in the prism depends on the refractive index of the prism material. Since that refractive index varies with wavelength, it follows that the angle that the light is refracted will also vary with wavelength, causing the angular separation of the light by wavelength. The prism thus refracts the light into a spectrum. The spectrum may be recorded by a recording device, as described below.

Figure 4:
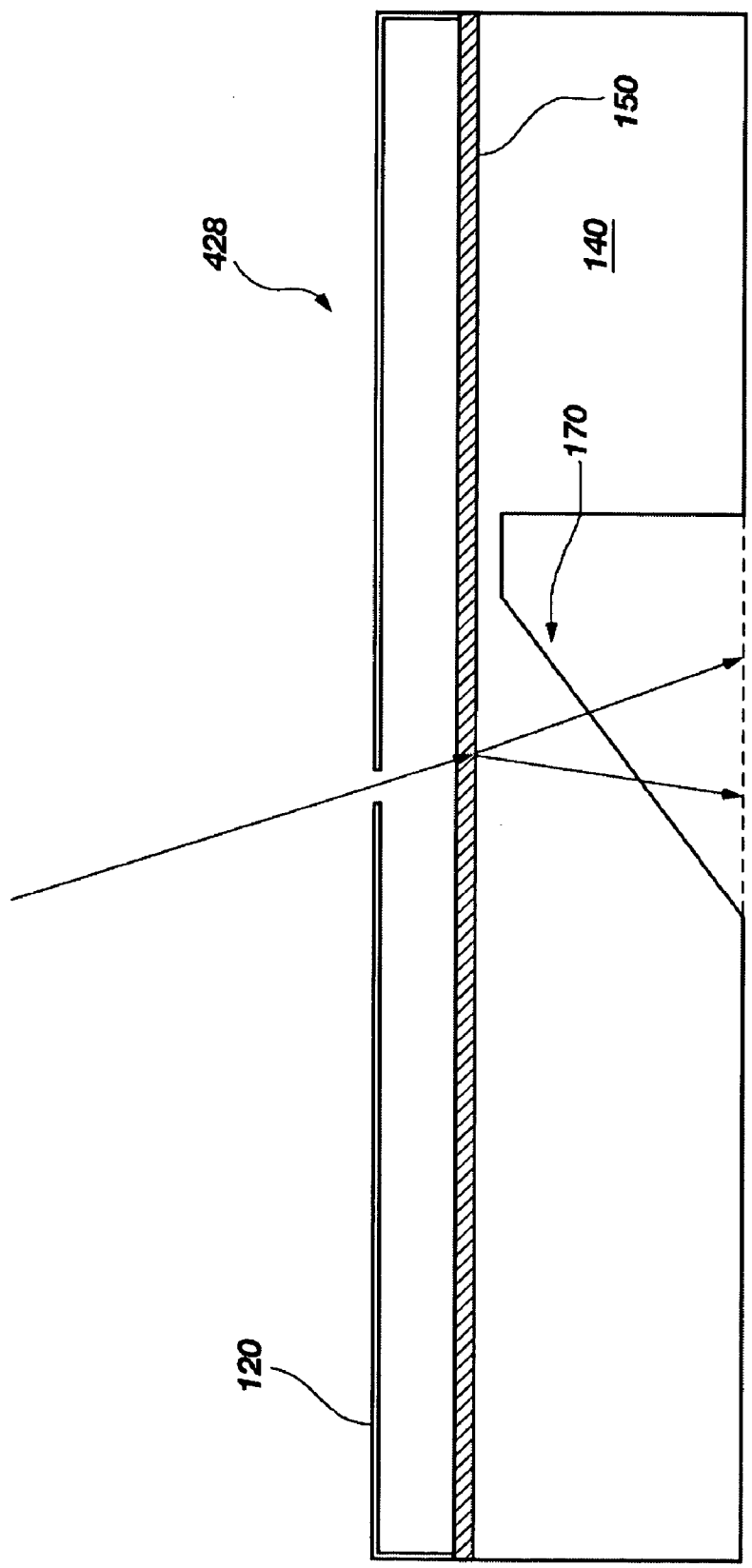
FIG. 4 is a schematic view of a fourth exemplary embodiment of a spectrometer module according to the present invention.

A fourth embodiment of the present invention, illustrated in FIG. 4, includes a substrate 140 and a prism 170 etched into the substrate 140 to form a spectrometer module 428. The refractive index of the material of the substrate 140 differs from the refractive index of the air filling the hollow prism 170. The light passing through this spectrometer module will also be refracted, forming a spectrum for recording.

Figure 5:
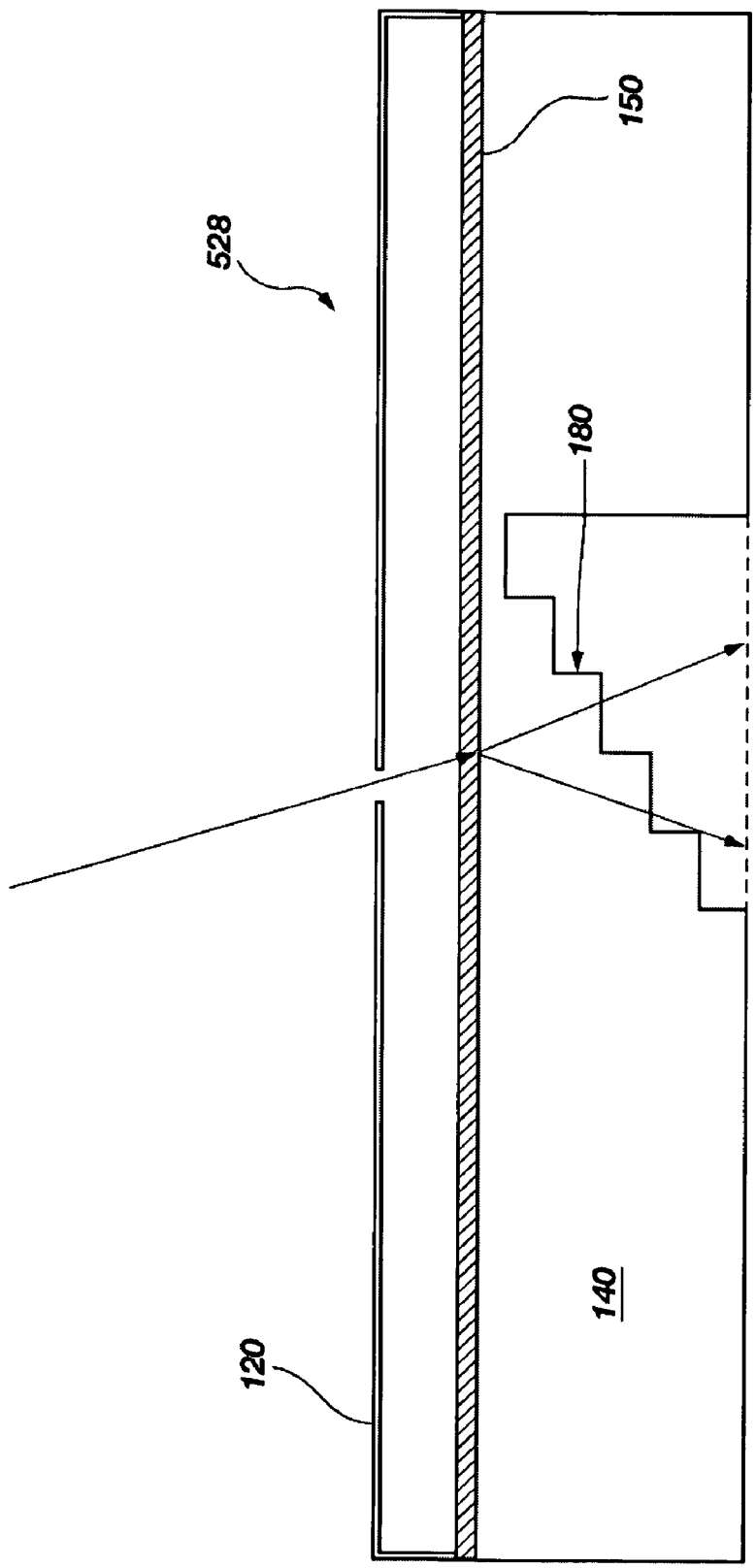
FIG. 5 is a schematic view of a fifth exemplary embodiment of a spectrometer module according to the present invention.

A fifth embodiment of a spectrometer module 528 according to the present invention, depicted in FIG. 5 is identical to the structure of FIG. 4, except that the prism etched into the substrate 140 is approximated by a stair step 180.

Figure 6A:
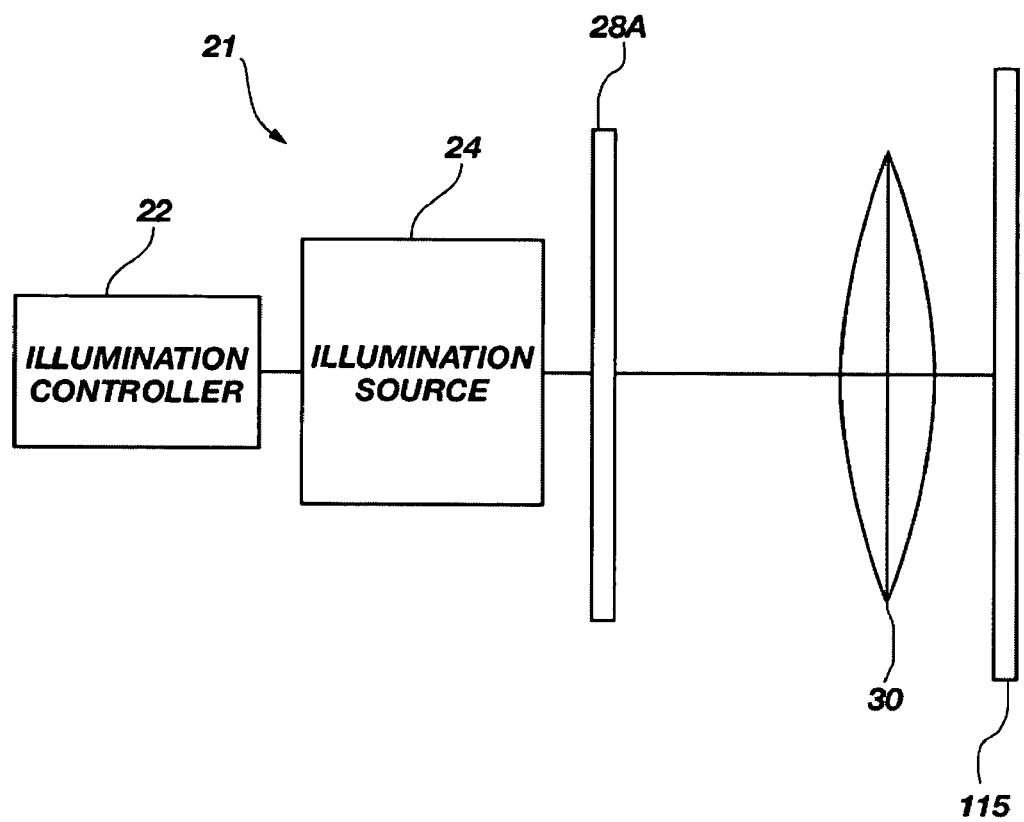
FIG. 6A is a schematic illustration of an optical imaging projection system according to the present invention.
Figure 6B:
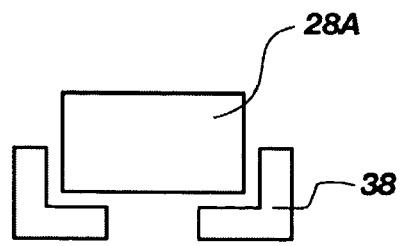
FIG. 6B is a schematic illustration of a spectrometer module carried by a reticle stage.
Figure 6C:
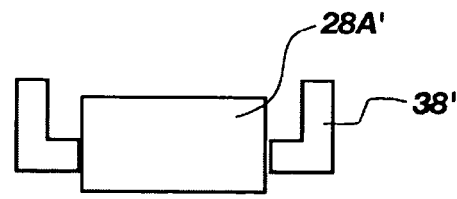
FIG. 6C is a schematic illustration of a spectrometer module built into a reticle stage.

A spectrometer module 28A may be positioned in a projection system at a reticle plane, as illustrated in FIG. 6A. Projection system 21 shows the spectrometer module 28A positioned adjacent to the illumination source 24; optionally, other devices, such as a pellicle or optical lenses, may separate the illumination source 24 and the spectrometer module 28A. Light passing through the spectrometer module 28A is further transmitted by a projection lens 30, which may be, for example, a reduction lens or a combination of lenses for focusing the reticle pattern onto a recording module 115, such as a semiconductor wafer covered with a photoresist layer or a CCD. The recording module 115 may be held in position by a wafer stage (not shown), which may be part of or controlled by a stepper (not shown). The spectrometer module 28A may be supported by a reticle stage 38, as shown in FIG. 6B, or the spectrometer module 28A' may be built into the reticle stage 38' as shown in FIG. 6C.

Figure 7A:
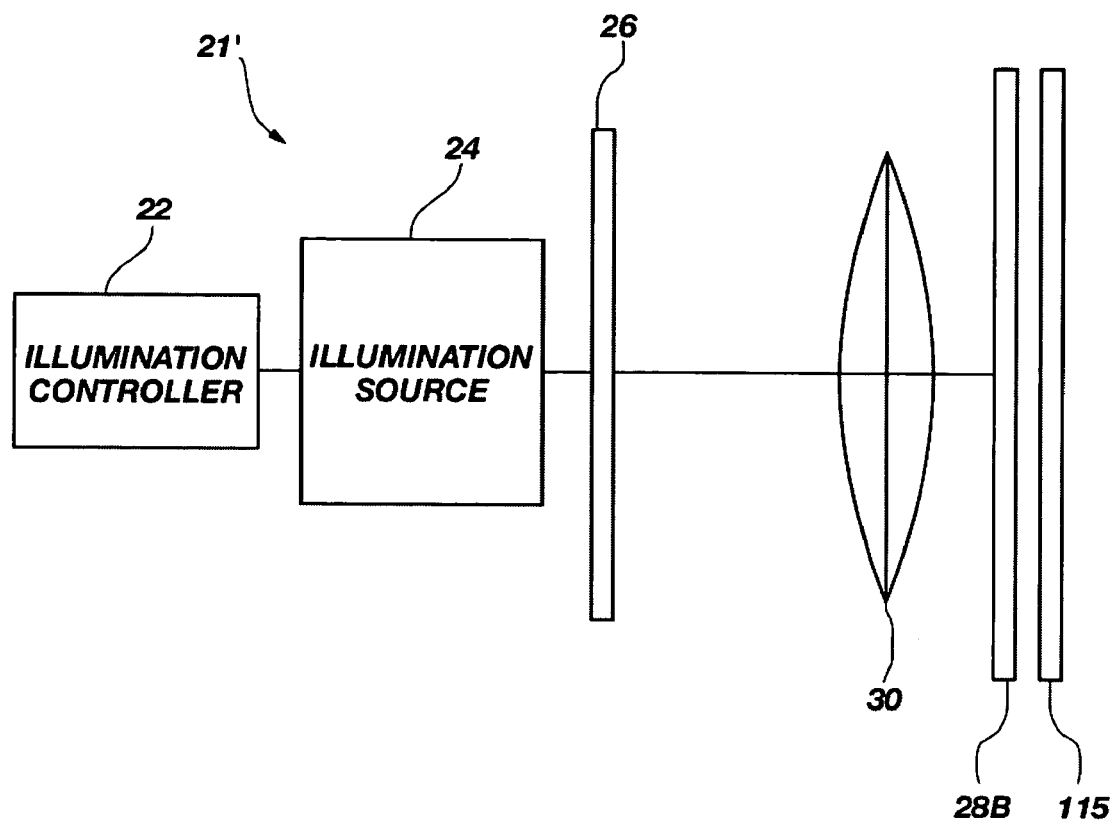
FIG. 7A is a schematic illustration of another optical imaging projection system according to the present invention.
Figure 7B:
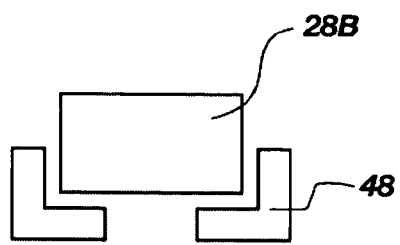
FIG. 7B is a schematic illustration of a spectrometer module carried by a wafer stage.
Figure 7C:
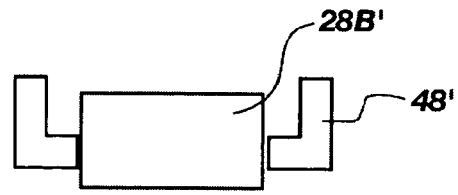
FIG. 7C is a schematic illustration of a spectrometer module built into a wafer stage.

The spectrometer module may, alternatively, be positioned in the projection system at the projection surface plane, as illustrated in FIG. 7A. The projection system 21' shows the light passing through the reticle plane 26 and further transmitted by the projection lens 30 for focusing the light onto a spectrometer module 28B. The recording module 15 (such as a semiconductor wafer covered with a photoresist layer) or an electronic device (such as a CCD) is positioned to receive the light dispersed by the spectrometer module 28B. The spectrometer module 28B may be held in position by a wafer stage 48 as shown in FIG. 7B, or the spectrometer module 28B' may be built into the wafer stage 48' as shown in FIG. 7C.

Figure 8:
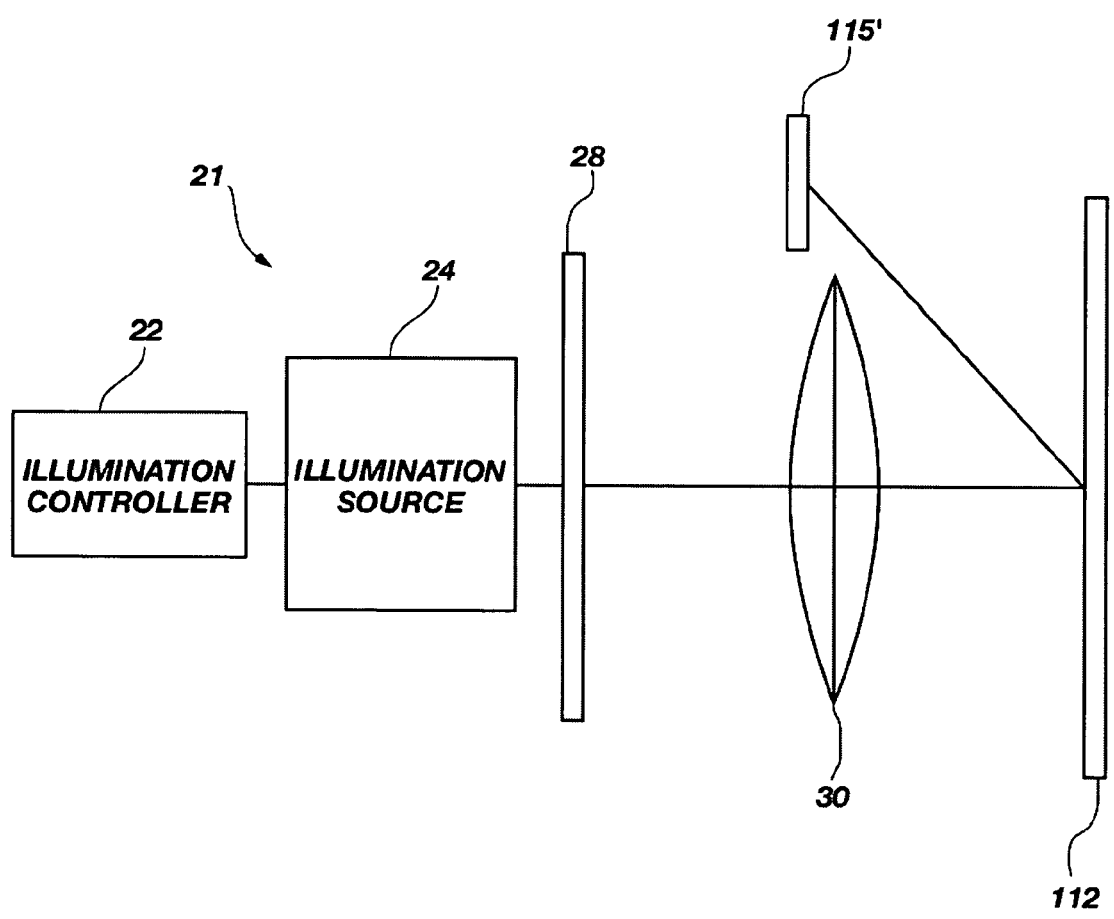
FIG. 8 is a schematic illustration of another configuration of an optical imaging projection system according to the present invention.

The recording module 115 may be part of a transmissive system or a reflective system. The positioning of recording module 115 illustrated in FIG. 7A is a part of a transmissive system, the light passing through the spectrometer module to the recording module 115. FIG. 8 illustrates a reflection system, where the light passing through the projection lens 30 is reflected, or bounced off a mirror or other reflective surface 112 to recording module 115'.

The spectrum formed by the beam of light 90 passing through the spectrometer module is focused onto a recording device or module 115. The recording device or module 115 is configured to generate sensory signals representative of the light spectrum received thereon. A photodetector may be used to accept an optical signal and produce an electrical signal containing the same information as in the optical signal. This is a sensitive, quantitative way of detecting the light and converting the spectrum directly into a digital form that can be handled on a computer. One suitable photodetector is a charge coupled device, or CCD. A CCD essentially comprises an array of tiny, light-sensitive diodes. The recording device or module 115 may be one of a variety of suitable apparatus, including without limitation a CCD camera, an intensified CCD detector, a charge injection device, a photomultiplier tube detector array, a photodiode array (hereinafter "PDA"), an intensified PDA, or an avalanche photodiode array. The sensory signals representative of the spectrum may be analyzed by a controller and compared to previously stored sensory signals of other stepper devices.

The recording device may, alternatively, comprise a layer of photoresist. The spectrum defined by the light passing through the spectrometer module is transferred onto the photoresist. Using a form of a photographic process, the photoresist is then developed to remove either the portions exposed to the radiant energy in the case of a "positive" photoresist or the unexposed portions when a "negative" photoresist is utilized. Use of a highly absorbing photoresist may prevent the recording device from being transparent. A low contrast photoresist may provide a clear profile of the spectrum, which may be of high contrast. The spectral distribution is depicted as intensity vs. wavelength in FIG. 9A and in the profile of photoresist 200 as schematically depicted in FIG. 9B. The residual photoresist pattern may thereafter serve as a template for a comparison of photoresist patterns of spectrums produced by other stepper devices.

The intensity of an illumination source may be measured by the clearing dose, or amount of energy needed to clear a given thickness of resist.

Figure 9A:
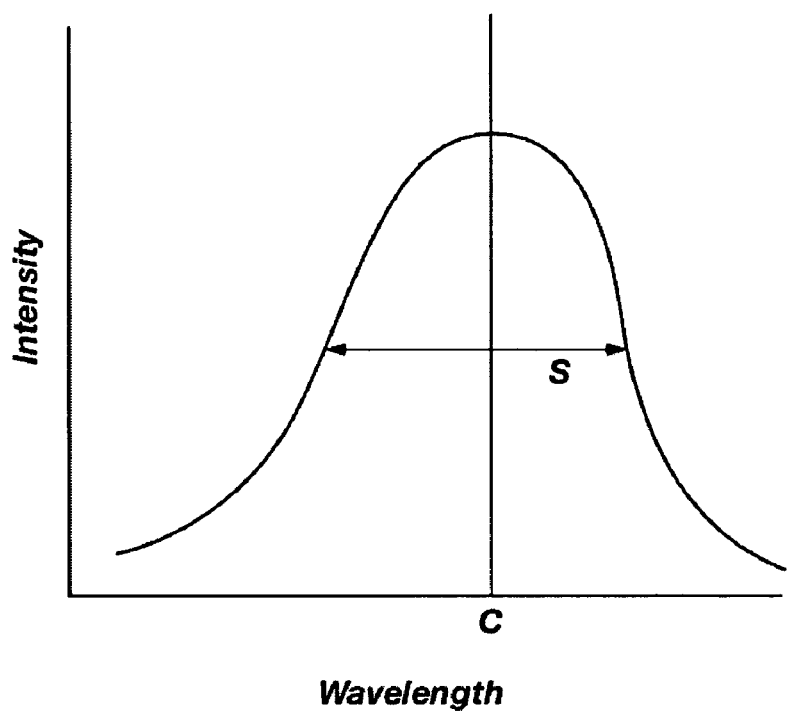
FIG. 9A is a diagram illustrating spectral distribution of an illumination source.
Figure 9B:
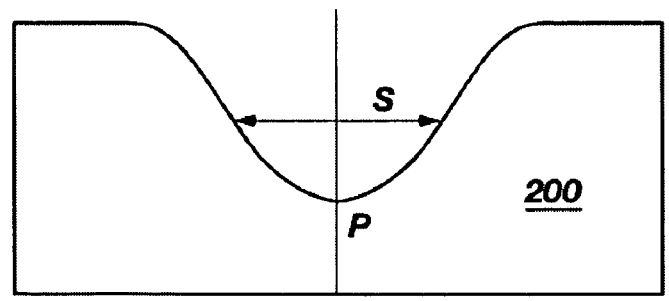
FIG. 9B is a cross-section view of a recorded spectral image of the present invention.

The illumination source central wavelength is represented by the wavelength of maximum intensity in the spectrum, denoted as "C" in the diagram of FIG. 9A. The horizontal position of the intensity peak "P" in the recorded spectrum represents the central wavelength. The spread in wavelengths may be measured by the Full-Width Half-Maximum (FWHM) of the recorded spectrum, marked as "S."

The in-situ spectrograph of the present invention may be utilized during stepper matching to reduce the impact of illumination source wavelength characteristics on wafer processing. As is appreciated by those of ordinary skill in the art, every stepper has its own unique illumination source and therefore each stepper tends to have a different spectrum recorded by the recording device for a given set of process conditions. The steppers that have similar spectrums as verified by the spectrometer module may be matched, thus minimizing the impact of the illumination source wavelength characteristics.

Stepper matching may be performed by first recording a spectrum of a first stepper, producing a standard spectrum for comparison. Next, a spectrum is produced and recorded for a number of additional steppers using the same processing conditions. The relative difference between each of the steppers may be calculated by comparing the standard spectrum and each of the recorded spectrums. If the spectrums of the steppers are similar, the wavelength characteristics of the illumination sources are similar, and the steppers tend to work well together.

Another method of stepper matching may be performed by adjusting the illumination source of each stepper. The wavelength characteristics of the illumination source may be adjusted to produce a recorded spectrum matching the standard spectrum, and thus, the wavelength characteristics of a standard illumination source.

An in-situ spectrograph may be used to determine the absolute wavelength of an illumination source. Referring back to FIG. 2A, a conventional spectrometer grating design may be used as the design of the spectrometer grating 110 of spectrograph module 128. The light diffracted through the spectrometer grating 110 forms interference patterns in sets of intensity peaks known as orders. The light passing through the spectrometer grating may be imaged as multiple groups of orders. The intensity peak of a set of one group can be made to coincide with the location of a minimum of a set of another group. The distance between two intensity peaks, each of a different group, represents the absolute wavelength.

A spectrometer grating may, alternatively, be used as the diffraction grating 110 of the spectrograph module 228, depicted in FIG. 2E. A spectrograph module, including a spectrometer grating, may be used in the reticle plane or the wafer plane of a projection image system, as part of a reflective or transmissive spectrograph (see FIGS. 6A, 7A, and 8).

Multiple spectrometer modules may be provided in a single plane, as depicted in FIG. 10. Light passes through both the first beam defining aperture and the second beam defining aperture. The blaze angle β, or the tilt of the facets or grooves of the first diffraction grating 110A, illustrated in FIG. 11A, and the second diffraction grating 110B, illustrated in FIG. 11B, are offset, so the angle of diffraction θ for light passing through first diffraction grating 110A and second diffraction grating 110B will be offset. The angle of diffraction θ is dependent on the wavelength, the relationship defined by Bragg's Law:

$$m\lambda = 2d \sin \theta$$

where m is an integer that labels the order of diffraction, λ is the wavelength, d is the distance between the peaks of the blazed grating, and θ is the angle of diffraction. Since the diffraction angle θ is dependent on the wavelength λ, an increase in the wavelength λ will cause an increase in the diffraction angle θ. Thus, the first order image 101A, diffracted by grating 110A will shift towards first order image 101B if the wavelength λ is increased. Therefore the distance n between the two first order images 101A, 101B is dependent on the central wavelength λ. The relative central wavelength of different illumination sources may thus be compared, and used for stepper matching.

As will be appreciated by those of ordinary skill in the art, the present invention enables stepper matching for illumination source wavelength characteristics and avoids overlay problems associated with unique illumination source wavelength characteristics of individual stepper illumination sources. Additionally, resolution enhancement techniques (RET) such as optical proximity correction (OPC) and off-axis illumination are conventionally used to optimize the design of a reticle in the manufacture of a semiconductor device. The RET process may be streamlined and standardized if the illumination source wavelength characteristics and spectral signatures for the steppers used together in a fabrication process are consistent.

Although the foregoing description contains many specifics, these should not be construed as limiting the scope of the present invention, but merely as providing illustrations of some exemplary embodiments. Similarly, other embodiments of the invention may be devised that do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A spectrograph for a projection imaging system employing an illumination source, comprising:
   a spectrometer module for positioning in a path of light produced by the illumination source and configured to separate the light by wavelength at a reticle plane of the projection imaging system and produce a dispersed light pattern;
   a projection lens configured to focus the dispersed light pattern on a wafer level focal plane; and
   a recording device for recording the dispersed light pattern.

2. The spectrograph of claim 1, wherein the spectrometer module is configured for support by a reticle stage.

3. The spectrograph of claim 1, wherein the spectrometer module is built into a reticle stage.

4. The spectrograph of claim 1, wherein the recording device comprises a light sensitive material.

5. The spectrograph of claim 1, wherein the recording device comprises a photodetector.

6. The spectrograph of claim 5, wherein the photodetector comprises a CCD.

7. The spectrograph of claim 1, wherein the recording device is configured to record light reflected from the wafer level focal plane.

8. The spectrograph of claim 1, wherein the recording device is configured to record light transmitted through the projection lens.

9. The spectrograph of claim 1, wherein the spectrometer module comprises a substrate and a photomask.

10. The spectrograph of claim 9, wherein the photomask comprises a diffraction grating.

11. The spectrograph of claim 9, wherein the substrate comprises at least one of soda-lime glass, borosilicate glass, quartz, and fused silica.

12. The spectrograph of claim 1, wherein the spectrometer module comprises a prism.

13. The spectrograph of claim 1, wherein the spectrometer module comprises a prism etched into a substrate.

14. The spectrograph of claim 13, wherein the substrate comprises at least one of soda-lime glass, borosilicate glass, quartz, and fused silica.

15. The spectrograph of claim 1, wherein the spectrometer module comprises a stair step etched into a substrate.

16. The spectrograph of claim 15, wherein the substrate comprises at least one of soda-lime glass, borosilicate glass, quartz, and fused silica.

17. The spectrograph of claim 1, wherein the spectrometer module is configured to be removable.

18. The spectrograph of claim 1, further comprising a pellicle including a beam-defining aperture positioned over the spectrometer module.

19. The spectrograph of claim 1, wherein the spectrometer module comprises:
a substrate having a top surface;
a chrome plating having a beam-defining aperture therethrough on the top surface of the substrate; and
a dispersion element positioned over the spectrometer module.

20. The spectrograph of claim 1, wherein the spectrometer module comprises a spectrometer grating.

21. A spectrograph for a projection imaging system employing an illumination source, comprising:
a spectrometer module for positioning in a wafer level focal plane of the projection imaging system, the spectrometer module configured to separate light produced by the illumination source by wavelength and produce a dispersed light pattern; and
a recording device having a surface for recording the dispersed light pattern, wherein the recording device surface is substantially parallel to the wafer level focal plane.

22. The spectrograph of claim 21, wherein the spectrometer module is configured to be supported by a wafer stage.

23. The spectrograph of claim 21, wherein the spectrometer module is built into a wafer stage.

24. The spectrograph of claim 21, wherein the recording device comprises a light sensitive material.

25. The spectrograph of claim 21, wherein the recording device comprises a photodetector.

26. The spectrograph of claim 25, wherein the photodetector comprises a CCD.

27. The spectrograph of claim 21, wherein the recording device is configured to record the dispersed light below the wafer level focal plane.

28. The spectrograph of claim 21, wherein the spectrometer module comprises a substrate and a photomask.

29. The spectrograph of claim 28, wherein the photomask comprises a diffraction grating.

30. The spectrograph of claim 29, wherein the substrate comprises at least one of soda-lime glass, borosilicate glass, quartz, and fused silica.

31. The spectrograph of claim 21, wherein the spectrometer module comprises a prism.

32. The spectrograph of claim 21, wherein the spectrometer module comprises a prism etched into a substrate.

33. The spectrograph of claim 32, wherein the substrate comprises at least one of soda-lime glass, borosilicate glass, quartz, and fused silica.

34. The spectrograph of claim 21, wherein the spectrometer module comprises a stair step etched into a substrate.

35. The spectrograph of claim 34, wherein the substrate comprises at least one of soda-lime glass, borosilicate glass, quartz, and fused silica.

36. The spectrograph of claim 21, wherein the spectrometer module is configured to be removable.

37. The spectrograph of claim 21, further comprising a pellicle including a beam-defining aperture positioned over the spectrometer module.

38. The spectrograph of claim 21, wherein the spectrometer module comprises:
a substrate having a top surface;
a chrome plating having a beam-defining aperture therethrough on the top surface of the substrate; and
a dispersion element positioned over the spectrometer module.

39. The spectrograph of claim 21, wherein the spectrometer module comprises a spectrometer grating.

40. A spectrograph for a projection imaging system employing an illumination source, comprising:
a first spectrometer module for positioning in a plane of the projection imaging system, the first spectrometer module configured to separate light produced by the illumination source by wavelength and produce a first dispersed light pattern;
a second spectrometer module for positioning in the plane, the second spectrometer module configured to separate the light produced by the illumination source by wavelength and produce a second dispersed light pattern; and
a recording device for recording the first dispersed light pattern and the second dispersed light pattern.

41. The spectrograph of claim 40, wherein the first spectrometer module is further configured to diffract the light produced by the illumination source in a first direction, and the second spectrometer module is further configured to diffract the light produced by the illumination source in a second direction.

42. A method of matching a plurality of steppers, comprising:
producing light within each stepper;
separating the light of each stepper by wavelength to form at least one spectrum;
recording the at least one spectrum of each stepper; and
mutually comparing the at least one spectrum of each stepper of the plurality to determine if at least two steppers of the plurality of steppers produce light having similar spectrums.

43. The method of claim 42, wherein separating the light is effected using a diffraction grating.

44. The method of claim 42, wherein separating the light is effected using a refraction device.

45. A method of detecting wavelength characteristics of an illumination source of a projection optical system, comprising:

providing a spectrometer module positioned in a reticle plane of the projection optical system;

projecting light of the illumination source through the spectrometer module and imaging a spectrum of the projected light;

receiving the spectrum with a projection lens;

focusing the spectrum with the projection lens onto a wafer plane; and recording the spectrum focused on the wafer plane.

46. The method of claim 45, wherein providing the spectrometer module comprises providing a substrate and a photomask for dispersing light of the illumination source projected therethrough.

47. The method of claim 46, wherein providing the substrate comprises forming the substrate of at least one of soda-lime glass, borosilicate glass, quartz, and fused silica.

48. The method of claim 47, wherein providing the photomask comprises forming a diffraction grating on the substrate.

49. The method of claim 45, wherein providing the spectrometer module comprises providing a prism for dispersing light of the illumination source projected therethrough.

50. The method of claim 45, wherein providing the spectrometer module comprises forming a substrate and etching a prism into a substrate.

51. The method of claim 50, wherein forming the substrate comprises forming the substrate of at least one of soda-lime glass, borosilicate glass, quartz, and fused silica.

52. The method of claim 45, wherein providing the spectrometer module comprises forming a substrate and etching a stair step into the substrate.

53. The method of claim 52, wherein forming the substrate comprises forming the substrate of at least one of soda-lime glass, borosilicate glass, quartz, and fused silica.

54. A method of detecting wavelength characteristics of light produced by an illumination source of a projection optical system, comprising:

projecting light of the illumination source through a projection lens onto a wafer plane of the projection optical system;

providing a spectrometer module positioned in the wafer plane to receive the projected light and image a spectrum;

orienting a light-receiving surface of a recording device substantially parallel to the wafer plane; and recording the spectrum as received through the light-receiving surface with the recording device.

55. The method of claim 54, wherein providing the spectrometer module comprises providing a substrate and a photomask for dispersing light of the illumination source projected therethrough.

56. The method of claim 55, wherein providing the substrate comprises forming the substrate of at least one of soda-lime glass, borosilicate glass, quartz, and fused silica.

57. The method of claim 56, wherein providing the photomask comprises forming a diffraction grating on the substrate.

58. The method of claim 54, wherein providing the spectrometer module comprises providing a prism for dispersing light of the illumination source projected therethrough.

59. The method of claim 54, wherein providing the spectrometer module comprises forming a substrate and etching a prism into a substrate.

60. The method of claim 59, wherein forming the substrate comprises forming the substrate of at least one of soda-lime glass, borosilicate glass, quartz, and fused silica.

61. The method of claim 54, wherein providing the spectrometer module comprises forming a substrate and etching a stair step into the substrate.

62. The method of claim 61, wherein forming the substrate comprises forming the substrate of at least one of soda-lime glass, borosilicate glass, quartz, and fused silica.

63. A method of comparing a central wavelength of light produced by illumination sources, comprising:

projecting light of a first illumination source through a plurality of spectrometer modules to produce a first plurality of spectrums;

recording the first plurality of spectrums;

measuring a first distance between two spectrums of the first plurality of spectrums;

projecting light of a second illumination source through the plurality of spectrometer modules to produce a second plurality of spectrums;

recording the second plurality of spectrums;

measuring a second distance between two spectrums of the second plurality of spectrums; and comparing the first distance and the second distance to compare a central wavelength of the first illumination source and a central wavelength of the second illumination source.

64. A method of measuring the absolute wavelength of light produced by an illumination source of a projection optical system, comprising:

projecting light of the illumination source through a spectrometer module having a spectrometer grating to produce a first plurality of spectrums;

recording the first plurality of spectrums;

measuring a first distance between two spectrums of the first plurality of spectrums;

projecting light of a second illumination source through the plurality of spectrometer modules, producing a second plurality of spectrums;

recording the second plurality of spectrums;

measuring a second distance between two spectrums of the second plurality of spectrums; and comparing the first distance and the second distance to determine the absolute wavelength of the projected light of the second illumination source.

* * * * *